United States Patent
Jiang et al.

(10) Patent No.: US 6,661,104 B2
(45) Date of Patent: Dec. 9, 2003

(54) MICROELECTRONIC ASSEMBLY WITH PRE-DISPOSED FILL MATERIAL AND ASSOCIATED METHOD OF MANUFACTURE

(75) Inventors: Tongbi Jiang, Boise, ID (US); Jason L. Fuller, Meridian, ID (US); Alan G. Wood, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/946,291

(22) Filed: Sep. 4, 2001

(65) Prior Publication Data

US 2002/0025602 A1 Feb. 28, 2002

Related U.S. Application Data

(62) Division of application No. 09/651,448, filed on Aug. 30, 2000, now Pat. No. 6,576,495.

(51) Int. Cl.⁷ .............................................. H01L 23/29
(52) U.S. Cl. ..................... 257/789; 257/787; 257/778; 257/790
(58) Field of Search ................................. 257/787, 790, 257/778, 772, 737, 786; 438/112, 124, 127, 789, 798

(56) References Cited

U.S. PATENT DOCUMENTS

| | | | | |
|---|---|---|---|---|
| 5,535,101 A | * | 7/1996 | Miles et al. | 361/808 |
| 5,656,857 A | * | 8/1997 | Kishita | 257/690 |
| 5,855,821 A | * | 1/1999 | Chau et al. | 252/514 |
| 5,866,953 A | * | 2/1999 | Akram et al. | 257/790 |
| 5,871,808 A | | 2/1999 | Thompson, Sr. | |
| 5,876,498 A | | 3/1999 | Thompson, Sr. | |
| 5,891,753 A | | 4/1999 | Akram | |
| 5,898,224 A | | 4/1999 | Akram | |
| 5,925,930 A | * | 7/1999 | Farnworht et al. | 257/737 |
| 6,063,647 A | | 5/2000 | Chen et al. | |
| 6,114,769 A | | 9/2000 | Thompson, Sr. | |
| 6,133,066 A | | 10/2000 | Murakami | |
| 6,194,250 B1 | | 2/2001 | Melton et al. | |
| 6,271,058 B1 | | 8/2001 | Yoshida | |
| 6,310,288 B1 | | 10/2001 | Moden | |

FOREIGN PATENT DOCUMENTS

JP           6-287273     * 10/1994     ................. 523/466

* cited by examiner

*Primary Examiner*—Jasmine Clark
(74) *Attorney, Agent, or Firm*—Perkins Coie LLP

(57) ABSTRACT

A microelectronic substrate assembly and method for manufacture. In one embodiment, bond members (such as solder balls) project away from a surface of the microelectronic substrate to define a fill region or cavity between the surface of the microelectronic substrate and the bond members. A fill material is disposed in the fill region, for example, by dipping the microelectronic substrate in reservoir of fill material so that a portion of the fill material remains attached to the microelectronic substrate. An exposed surface of the fill material is engaged with a support member, such as a printed circuit board, and the bond members are attached to corresponding bond pads on the support member. The microelectronic substrate and the fill material can then be encapsulated with an encapsulating material to form a device package.

31 Claims, 2 Drawing Sheets

MICROELECTRONIC ASSEMBLY WITH PRE-DISPOSED FILL MATERIAL AND ASSOCIATED METHOD OF MANUFACTURE

This application is a divisional of pending U.S. patent application Ser. No. 09/651,448, filed on Aug. 30, 2000 now U.S. Pat. No. 6,576,495.

TECHNICAL FIELD

The present invention relates to microelectronic substrate packages having a pre-disposed fill material for mounting the package to a supporting member.

BACKGROUND

Packaged microelectronic assemblies, such as memory chips and microprocessor chips, typically include a microelectronic substrate die encased in a plastic, ceramic or metal protective covering. The die includes functional devices or features, such as memory cells, processor circuits and interconnecting wiring. The die also typically includes bond pads electrically coupled to the functional devices. The bond pads can be coupled to pins or other types of terminals that extend outside the protective covering for connecting to buses, circuits, and/or other microelectronic assemblies.

One conventional "flip chip" package 10 shown in plan view in FIG. 1 includes a microelectronic die 20 having a downwardly facing surface 24 with solder ball pads 22, and an upwardly facing surface 23 opposite the downwardly facing surface 24. Solder balls 21 are attached to the solder ball pads 22 and dipped in flux. The die 20 is then positioned with the downwardly facing surface 24 facing toward a printed circuit board (PCB) 30 to engage the solder balls 21 with corresponding bond pads 31 on the PCB 30. The solder balls 21 are partially melted or "reflowed" and solidified to form structural and electrical bonds with the bond pads 31 on the PCB 30.

In one aspect of the arrangement shown in FIG. 1, a gap corresponding roughly to the diameter of the solder balls 21 remains between the upper surface of the PCB 30 and the downwardly facing surface 24 of the die 20 after the die 20 has been attached. The gap can be detrimental to the integrity and performance of the die 20 because it can allow oxidizing agents and other contaminants to attack the solder ball bond between the die 20 and the PCB 30. Furthermore, the gap can reduce the rate at which heat is transferred away from the die 20, reducing the life expectancy and/or the performance level of the die 20.

To alleviate the foregoing drawbacks, an underfill material 40 is typically introduced into the gap between the die 20 and the PCB 30. For example, in one conventional approach, a bead of flowable epoxy underfill material 40 is positioned on the PCB 30 along two edges of the die 20. The underfill material 40 is heated until it flows and fills the gap by capillary action, as indicated by arrows "A." The underfill material 40 can accordingly protect the solder ball connections from oxides and other contaminants, and can increase the rate at which heat is transferred away from the die 20. The underfill material 40 can also increase the rigidity of the connection between the die 20 and the PCB 30 to keep the package 10 intact during environmental temperature changes, despite the fact that the die 20, the solder balls 21 and the PCB 30 generally have different coefficients of thermal expansion.

One drawback with the capillary action approach described above for applying the underfill material 40 is that the underfill material 40 can take up to 20 minutes or longer to wick its way to into the gap between the die 20 and the PCB 30. Accordingly, the capillary underfill process can significantly increase the length of time required to produce the packages 10. One approach to addressing this drawback (typically referred to as a "no-flow" process) is to first place the underfill material directly on the PCB 30 and then place the die 20 on the underfill material. For example, as shown in FIG. 2A, a quantity of underfill material 40a having an integrated quantity of flux can be disposed on the PCB 30 adjacent to the bond pads 31. As shown in FIG. 2B, the die 20 can be lowered onto the PCB 30 until the solder balls 21 contact the bond pads 31 of the PCB 30. As the solder balls 21 approach the bond pads 31, the die 20 contacts the underfill material 40a and squeezes the underfill material 40a outwardly around the solder balls 21 and between the downwardly facing surface 24 of the die 20 and the upper surface of the PCB 30, as indicated by arrows "B". An encapsulating material 70 is then disposed on the die 20 and the PCB 30.

One problem with the no-flow process described above with reference to FIGS. 2A–2B is that air bubbles can become trapped between the die 20 and the PCB 30. The air bubbles can reduce the effective bond area between the die 20 and the PCB 30 and can make the die 20 more likely to separate from the PCB 30. Furthermore, oxygen in the air bubbles can oxidize the connection between the solder balls 21 and the solder ball pads 22 and/or the bond pads 31 to reduce the integrity of the structural and/or electrical connections between the die 20 and the PCB 30.

Another problem with the process described above with reference to FIGS. 2A–2B is that it can be difficult to accurately meter the amount of underfill material 40a applied to the PCB 30. For example, if too little underfill material 40a is provided on the PCB 30, the solder balls 21 may not be adequately covered. Even if the underfill material 40a extends beyond the solder balls 21 to the edge of the die 20 (as indicated in dashed lines in FIG. 2B by position $P_1$), it can exert a tensile force on the die 20 that tends to separate the die 20 from the PCB 30. Conversely, if too much underfill material 40a is provided on the PCB 30, the underfill material can extend over the upperwardly facing surface 23 of the die 20 (as indicated in dashed lines in FIG. 2B by position $P_2$), and can form protrusions 49. The protrusions 49 can be subjected to high stress levels when the die 20 is encapsulated with the encapsulating material 70, and can cause the underfill material 40a to separate from the die 20. Still further, the underfill material 40a can become trapped between the solder balls 21 and the bond pads 31 and can interfere with the electrical connections between the die 20 and the PCB 30.

SUMMARY

The present invention is directed toward microelectronic device packages and methods for forming such packages by bonding microelectronic substrates to support members, such as PCBs. A method in accordance with one aspect of the invention includes disposing a fill material in a fill region defined by a surface of the microelectronic substrate before engaging the fill material with the support member. The fill region can also be defined in part by a bond member (such as a solder ball) or other protrusion projecting away from the surface of the microelectronic substrate. The method can further include engaging the fill material with the support member after disposing the fill material in the fill region, and connecting the bond member and the fill material to the support member. The microelectronic substrate and the fill material can then be at least partially enclosed with an encapsulating material.

In one aspect of the invention, the microelectronic substrate is dipped into a vessel of fill material and is then removed from the vessel with a portion of the fill material attached to the surface of the microelectronic substrate. Accordingly, the fill material can have a thixotropic index with a value of from about four to about six. In another aspect of the invention, the surface of the microelectronic substrate can be a first surface and the microelectronic substrate can include a plurality of second surfaces extending away from the first surface, and a third surface facing opposite the first surface. The extent to which the fill material engages the second surfaces of the microelectronic substrate can be controlled so that the fill material engages a portion of the second surfaces extending from the first surface to a point about 60% to about 70% of the distance from the first surface to the third surface of the microelectronic substrate.

The invention is also directed toward a microelectronic substrate assembly. In one embodiment, the assembly includes a microelectronic substrate having a substrate surface and at least one bond member extending away from the substrate surface and configured to bond to a support member. A volume of uncured fill material is attached to the substrate surface and to the bond member, with the fill material having an exposed surface to engage the support member. In another aspect of the invention, the microelectronic substrate and the bond member are attached to the support member and the fill material has a thixotropic index of from about four to about six when uncured.

DETAILED DESCRIPTION

The present disclosure describes packaged microelectronic devices and methods for manufacturing such devices. Many specific details of certain embodiments of the invention are set forth in the following description and in FIGS. 3A–3D to provide a thorough understanding of these embodiments. One skilled in the art, however, will understand that the present invention may have additional embodiments, and the invention may be practiced without several of the details described below.

Figure 3A:
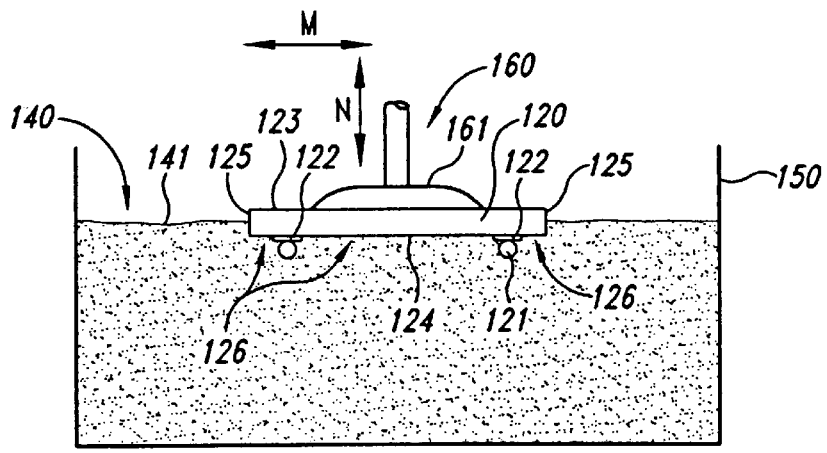
FIGS. 3A–3D illustrate a process for mounting a microelectronic substrate to a support member in accordance with an embodiment of the invention.

FIG. 3A is a partially schematic, side elevational view of a microelectronic substrate 120 supported relative to a vessel 150 containing a fill material 140 in accordance with an embodiment of the invention. In one aspect of this embodiment, the microelectronic substrate 120 has an upper surface 123, a lower surface 124 opposite the upper surface 123, and four side surfaces 125 extending between the upper surface 123 and the lower surface 124. The microelectronic substrate 120 further includes solder ball pads 122 on the lower surface 124 that are connected to devices and features (not shown in FIG. 3A) internal to the microelectronic substrate 120. A plurality of bond members 121, such as solder balls, are connected to the solder ball pads 122. The surfaces of the bond members 121 and the lower surface 124 of the microelectronic substrate 120 define a fill region or cavity 126. Alternatively, the microelectronic substrate 120 can have terminals other than the solder ball pads 122, and/or the bond members 121 can include conductive epoxy bumps, metal coated polymer studs or other conductive elements. In still another embodiment, the microelectronic substrate 120 can have other protrusions (that are not necessarily electrically conductive) extending away from the lower surface 124. The fill region 126 of these other embodiments is defined by the lower surface 124 and the other types of protrusions that project from the lower surface 124.

FIG. 3A illustrates a stage of a method in accordance with an embodiment of the invention in which the substrate 120 is partially submerged in the fill material 140. In one embodiment, a positioning apparatus 160 supports the microelectronic substrate 120 relative to the vessel 150. In one aspect of this embodiment, the positioning apparatus can include a "pick and place" device conventionally used to pick up a microelectronic substrate for applying flux to solder balls of the substrate. The positioning apparatus 160 can include a suction cup 161 or another mechanism for releasably engaging the microelectronic substrate 120. The apparatus 160 can further include an actuator (not shown) to move the microelectronic substrate 120 laterally as indicated by arrow M and/or axially as indicated by arrow N. Accordingly, the apparatus 160 can position the microelectronic substrate 120 over the vessel 150, lower the microelectronic substrate 120 a selected distance into the fill material 140 within the vessel 150, and remove the microelectronic substrate 120 from the vessel 150.

Figure 3B:
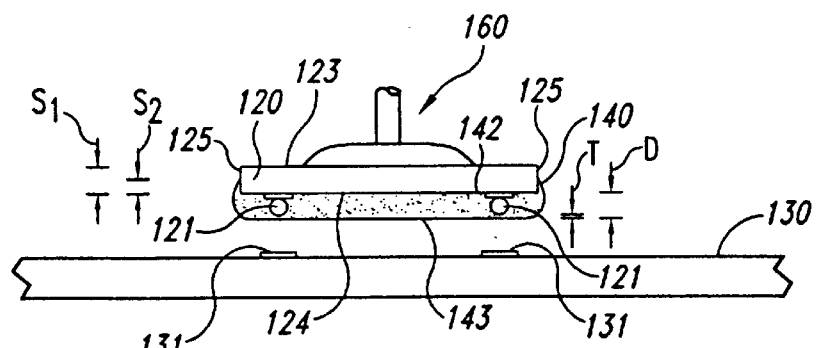

In one aspect of this embodiment, the microelectronic substrate 120 is partially immersed in the fill material 140 by lowering the microelectronic substrate 120 into the fill material 140 until the lower surface 124 of the microelectronic substrate 120 is positioned beneath a free surface 141 of the fill material 140. The microelectronic substrate 120 is then withdrawn from the vessel 150. Referring now to FIG. 3B, a quantity of the fill material 140 remains attached to the microelectronic substrate 120 after the microelectronic substrate 120 has been withdrawn from the vessel 150 (FIG. 3A). The fill material 140 can have an upper surface 142 adjacent to the microelectronic substrate 120 and an exposed lower surface 143 facing opposite the upper surface 142. The fill material 140 can also extend partially up the sides 125 of the microelectronic substrate 120. For example, in one embodiment, the fill material 140 can extend from the lower surface 124 up the sides 125 by a distance $S_2$ that is from about 60% to about 70% of a distance $S_1$ between the lower surface 124 and the upper surface 123. The fill material 140 can also form a thin layer over the lower surfaces of the bond members 121. For example, when the bond members 121 have a diameter D of about 150 microns, the thickness T of the layer of fill material 140 adjacent to the bond members 121 can be about 25 microns or less. In other embodiments, the thickness T of the fill material layer can have other dimensions, so long as the fill material 140 does not interfere with the electrical connections to the bond members 121, as described below.

Figure 3C:
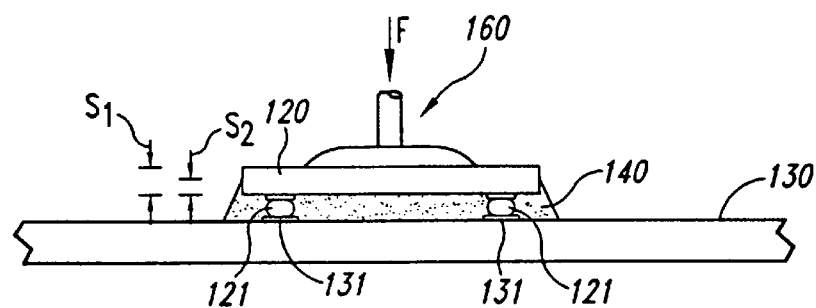

Once the microelectronic substrate 120 has been withdrawn from the vessel 150, the positioning apparatus 160 can move the microelectronic substrate 120 and the attached fill material 140 into position over a support member 130, which can include a PCB or another suitable substrate. The positioning apparatus 160 then aligns the bond members 121 of the microelectronic substrate 120 with corresponding bond pads 131 of the support member 130. Referring now to FIG. 3C, the positioning apparatus 160 lowers the microelectronic substrate 120 toward the support member 130 until the fill material 140 contacts the support member 130.

The fill material 140 can also contact the bond pads 131. The positioning apparatus 160 or another apparatus can optionally drive the microelectronic substrate 120 further downward to press bonding surfaces of the bond members 121 directly against the bond pads 131 and to squeeze out intervening fill material 140 between the bond members 121 and the bond pads 131. As the fill material 140 stabilizes, it can extend partially up the sides 125 of the microelectronic substrate 120 by the distance $S_2$, as described above with reference to FIG. 3B.

Figure 3D:
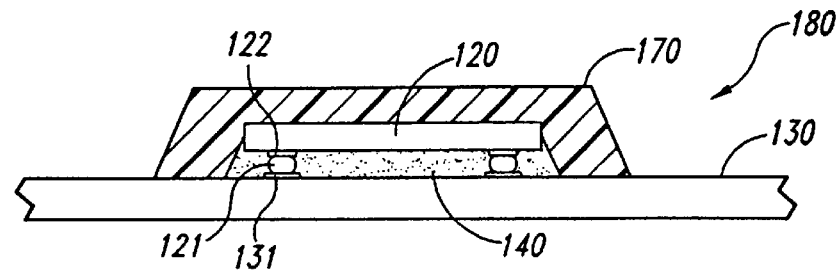

When the bond members 121 are solder balls, the bond members 121 can be heated (for example, in a reflow process) to attach the bond members 121 to the bond pad 131. The fill material 140 can be cured either as part of the reflow process or in a separate heat cycle to harden the fill material 140 and securely fix the fill material 140 to the microelectronic substrate 120 and the support member 130. Referring now to FIG. 3D, an encapsulating material 170 is then disposed over the assembled microelectronic substrate 120 and support member 130 to form a package 180 that protects the microelectronic substrate 120 and the connections between the microelectronic substrate 120 and the support member 130.

In one embodiment, the fill material 140 can have several characteristics that make it particularly suitable for use with the process described above with reference to FIGS. 3A–3D. For example, the fill material 140 can be in a liquid or gel state at room temperature in one embodiment so that the dipping process can be conducted at room temperature. In another aspect of this embodiment, the fill material 140 can be relatively thick and viscous at room temperature so as to remain attached to the microelectronic substrate 120 when the microelectronic substrate 120 is withdrawn from the vessel 150. For example, the fill material 140 can have a thixotropic index of from about four to about six, and in one specific embodiment, the fill material 140 can have thixotropic index of about five. In a further aspect of this embodiment, the fill material 140 can include a conventional underfill epoxy material thickened to achieve the desired thixotropic index. For example, the fill material 140 can include FF 2000 epoxy (available from Dexter Labs of City of Industry, Calif.), which has an initial thixotropic index of from about one to about two. The epoxy can be thickened with thickening agents (such as barium sulfate) to increase the thixotropic index to a value of from about four to about six. Alternatively, the fill material 140 can have other suitable compositions and formulations.

In still another aspect of an embodiment of the process described above with reference to FIGS. 3A–3D, the fill material 140 can include a small amount of a surfactant, for example, about 1% or less by volume. Accordingly, the fill material 140 can have a reduced tendency (when compared to conventional underfill materials) for forming voids or pockets (a) at the interface between the microelectronic substrate 120 and the fill material 140 when the microelectronic substrate 120 is partially immersed in the fill material 140, and (b) at the interface between the fill material 140 and the support member 130 when the microelectronic substrate 120 is mounted to the support member 130. An advantage of this arrangement is that the fill material 140 is more likely to form a secure and hermetically sealed bond between the microelectronic substrate 120 and the support member 130.

Figure 1:
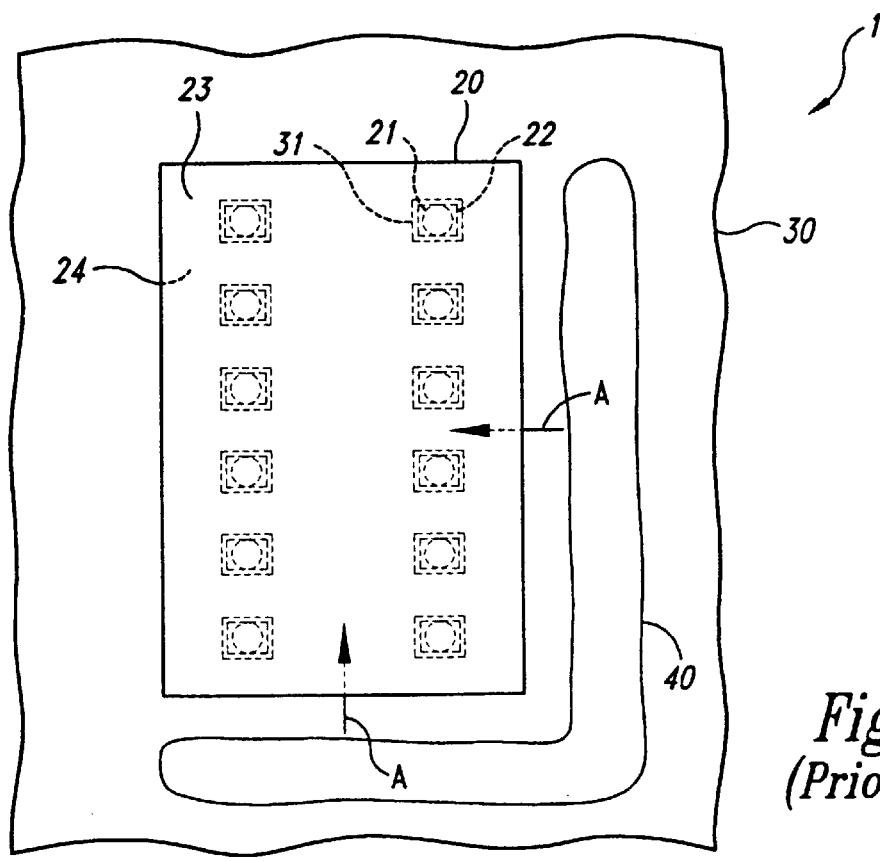
FIG. 1 is a partially schematic, plan view of a die mounted on a PCB in accordance with the prior art.
Figure 2A:
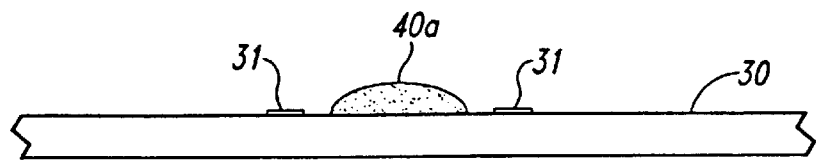
FIGS. 2A–2B illustrate steps in a process for mounting a die to a PCB in accordance with another prior art method.
Figure 2B:
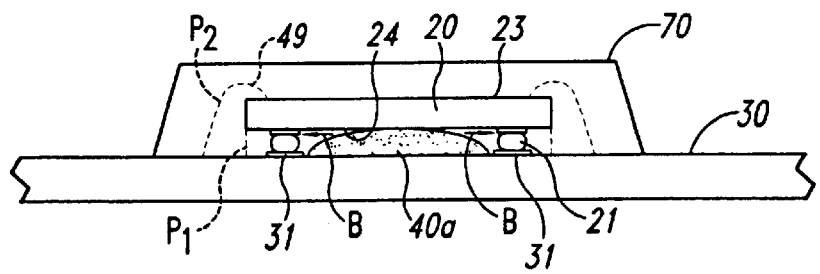

Another advantage of an embodiment of the process described above with reference to FIGS. 3A–3D is that the amount of fill material 140 attached to each microelectronic substrate 120 can be controlled. For example, the height $S_2$ to which the fill material 140 extends up the sides 125 of the microelectronic substrate 120 can be controlled by controlling the thixotropic index and wettability of the fill material 140, and the depth to which the microelectronic substrate 120 is immersed in the fill material 140. Furthermore, the thickness T of the fill material 140 adjacent to the solder balls 121 can be controlled by controlling the thixotropic index of the fill material 140. Still further, the total amount of fill material 140 that adheres to the microelectronic substrate 120 varies with the size of the microelectronic substrate 120, and in particular, the surface area of the lower surface 124. For example, as the size of the lower surface 124 increases, the amount of fill material 140 adhering to the lower surface 124 increases correspondingly. Accordingly, the amount of fill material 140 adhering to each microelectronic substrate 120 self-adjusts to the size of the microelectronic substrate 120. This is unlike some conventional underfill methods described above with reference to FIGS. 1–2B which require changing the amount of underfill material applied to the PCB whenever the size of the microelectronic substrate is changed.

Yet another advantage of an embodiment of the process described above with reference to FIGS. 3A–3D is that the relatively high thixotropic index of the fill material 140 can increase the strength of the initial bond between the uncured liquid or gel fill material 140, the microelectronic substrate 120, and the support member 130 (i.e., the "green strength" of the bond). For example, the more viscous fill material 140 can more securely support the microelectronic substrate 120 in position on the support member 130 during the interim period between attaching the microelectronic substrate 120 to the support member 130 and curing the fill material 140. This feature can be advantageous because the microelectronic substrate 120 is expected to be less likely to move relative to the support member 130 during operations that take place before the fill material 140 is cured. Such operations can include moving the microelectronic substrate 120 and support member 130 from one processing station to the next and/or reflowing the bond members 121.

In other embodiments, the processes and materials described above with reference to FIGS. 3A–3D can have other configurations and arrangements. For example, in one alternate embodiment, the temperature of the reservoir 150 can be controlled to control the viscosity of the fill material 140. In another alternate embodiment, the fill material 140 can be disposed on the microelectronic substrate 120 by processes other than dipping. For example, the fill material 140 can be sprayed onto the microelectronic substrate 120 in one or more coats, or the fill material 140 can be deposited in the fill region using stencil printing or pen-type dispensers known in the surface mounting technology arts.

In still further embodiments, the fill material 140 can have suitable configurations other than the configurations described above. The fill material 140, for example, can be any type of material that can be applied to the lower surface of the microelectronic substrate 120 before attaching the substrate 120 to a support member 130 for filling the gap between the substrate 120 and the support member 130. Moreover, the bond members 121 need not include solder balls, and/or the microelectronic substrate 120 can have protrusions other than bond members that define a fill region or cavity adjacent to the lower surface 124. In yet another embodiment, the microelectronic substrate 120 can have no protrusions, so long as the fill material 140 is applied to the lower surface 124 or a portion of the lower surface 124 prior to attaching the microelectronic substrate 120 to the support member 130. In one aspect of this embodiment, the bond members 121 can first be attached to the support member 130 and then connected to terminals (such as bond pads) of the microelectronic substrate 120 that are flush with the lower surface 124 of the microelectronic substrate 120. In still another embodiment, the pre-disposed fill material 140 can be supplemented with additional fill material disposed on the support member 130 in a manner generally similar to that described above with reference to FIG. 1 or FIGS. 2A–2B.

From the foregoing, it will be appreciated that, although specific embodiments of the invention have been described herein for purposes of illustration, various modifications may be made without from deviating from the spirit and scope of the invention. Accordingly, the invention is not limited except as by the appended claims.

What is claimed is:

1. A microelectronic substrate assembly formed by a method, comprising:

disposing a quantity of fill material in a cavity defined by a surface of the microelectronic substrate and a bond member projecting away from the surface of the microelectronic substrate before engaging the fill material with a support member, wherein disposing the fill material in the cavity includes dipping the microelectronic substrate in a vessel of fill material and removing the microelectronic substrate from the vessel with a portion of the fill material attached to the surface of the microelectronic substrate;

engaging the fill material with the support member after disposing the fill material in the cavity; and connecting the bond member and the fill material to the support member.

2. The microelectronic substrate assembly of claim 1 wherein the bond member includes a solder ball and wherein connecting the bond member includes connecting the solder ball.

3. The microelectronic substrate assembly of claim 1 wherein engaging the fill material includes engaging the fill material when the fill material is in an at least partially uncured state, and wherein the method further comprises curing the fill material after connecting the bond member and the fill material to the support member.

4. The microelectronic substrate assembly of claim 1 wherein the surface of the microelectronic substrate is a first surface and wherein the microelectronic substrate includes a plurality of second surfaces extending away from the first surface, and wherein the method further comprises disposing at least a portion of the fill material adjacent to at least one of the second surfaces of the microelectronic substrate.

5. A microelectronic substrate assembly including a microelectronic substrate having a first surface, a plurality of second surfaces extending away from the first surface, the microelectronic substrate assembly being formed by a method, comprising:

dipping the microelectronic substrate into a reservoir of flowable fill material at least until the first surface of the microelectronic substrate is positioned beneath a free surface of the fill material in the reservoir and the fill material contacts the second surfaces of the microelectronic substrate;

disposing a quantity of fill material in a cavity defined by a surface of the microelectronic substrate and a bond member projecting away from the surface of the microelectronic substrate before engaging the fill material with a support member;

engaging the fill material with the support member after disposing the fill material in the cavity; and connecting the bond member and the fill material to the support member.

6. The microelectronic substrate assembly of claim 5 wherein the bond member includes a solder ball and wherein connecting the bond member includes connecting the solder ball.

7. The microelectronic substrate assembly of claim 5 wherein engaging the fill material includes engaging the fill material when the fill material is in an at least partially uncured state, and wherein the method further comprises curing the fill material after connecting the bond member and the fill material to the support member.

8. A microelectronic substrate assembly formed by a method, comprising:

disposing a quantity of fill material in a cavity defined by a surface of the microelectronic substrate and a bond member projecting away form the surface of the microelectronic substrate before engaging the fill material with a support member, the fill material having a thixotropic index of from about four to about six;

engaging the fill material with the support member after disposing the fill material in the cavity; and connecting the bond member and the fill material to the support member.

9. The microelectronic substrate assembly of claim 8 wherein the bond member includes a solder ball and wherein connecting the bond member includes connecting the solder ball.

10. The microelectronic substrate assembly of claim 8 wherein engaging the fill material includes engaging the fill material when the fill material is in an at least partially uncured state, and wherein the method further comprises curing the fill material after connecting the bond member and the fill material to the support member.

11. The microelectronic substrate assembly of claim 8 wherein the surface of the microelectronic substrate is a first surface and wherein the microelectronic substrate includes a plurality of second surfaces extending away from the first surface, and wherein the method further comprises disposing at least a portion of the fill material adjacent to at least one of the second surfaces of the microelectronic substrate.

12. A microelectronic substrate assembly formed by a method, comprising:

disposing a quantity of fill material in a cavity defined by a surface of the microelectronic substrate and a bond member projecting away from the surface of the microelectronic substrate before engaging the fill material with a support member;

engaging the fill material with the support member after disposing the fill material in the cavity;

connecting the bond member and the fill material to the support member, wherein the fill material is initially in a flowable state; and curing the fill material to solidify the fill material.

13. The microelectronic substrate assembly of claim 12 wherein the bond member includes a solder ball and wherein connecting the bond member includes connecting the solder ball.

14. The microelectronic substrate assembly of claim 12 wherein engaging the fill material includes engaging the fill material when the fill material is in an at least partially uncured state, and wherein the method further comprises curing the fill material after connecting the bond member and the fill material to the support member.

15. A microelectronic substrate assembly formed by a method, comprising:

disposing a quantity of fill material in a cavity defined by a surface of the microelectronic substrate and a bond member projecting away from the surface of the microelectronic substrate before engaging the fill material with a support member, wherein the bond member includes a solder ball having a diameter of about 150 microns and a bonding surface facing away from the microelectronic substrate, and wherein disposing the fill material includes disposing the fill material to a thickness of about 25 microns or less beyond the bonding surface of solder balls.

16. A microelectronic substrate assembly for mounting to a support member, comprising:

a microelectronic substrate having a first surface and a plurality of second surfaces extending away from the first surface, a third surface facing in a direction opposite the first surface, and at least one bond member extending away from the substrate surface to define a fill region on the substrate surface, the bond member being configured to be bonded to the support member; and a volume of uncured fill material disposed in the fill region and having a first surface attached to at least the substrate surface, the fill material having a second surface exposed before attaching the microelectronic substrate to the support member wherein the fill material engages a portion of the second surfaces extending from the first surface to a point from about 60% to about 70% of the distance from the first surface to the third surface of the microelectronic substrate.

17. The microelectronic substrate of claim 16 wherein the at least one bond member includes a solder ball.

18. A microelectronic substrate assembly for mounting to a support member, comprising:

a microelectronic substrate having a substrate surface and at least one bond member extending away from the substrate surface to define a fill region on the substrate surface, the bond member being configured to be bonded to the support member, wherein the bond member includes a solder ball having a diameter of about 150 microns and a bonding surface facing away from the microelectronic substrate;

a volume of uncured fill material disposed in the fill region and having a first surface attached to at least the substrate surface, the fill material having a second surface exposed before attaching the microelectronic substrate to the support member, wherein the fill material has a thickness of about 25 microns or less beyond the bonding surface of the solder ball.

19. The microelectronic substrate assembly of claim 18 wherein the substrate surface is a first substrate surface and wherein the microelectronic substrate includes at least one second substrate surface extending away from the first substrate surface, and a third substrate surface facing opposite the first substrate surface, and wherein the fill material engages a portion of the at least one second surface extending from the first substrate surface to a point about 60% to about 70% of the distance from the first substrate surface to the third substrate surface.

20. A microelectronic substrate assembly for mounting to a support member, comprising:

a microelectronic substrate having a substrate surface and at least one bond member extending away from the substrate surface to define a fill region on the substrate surface, the bond member being configured to be bonded to the support member; and a volume of uncured fill material disposed in the fill region and having a first surface attached to at least the substrate surface, the fill material having a second surface exposed before attaching the microelectronic substrate to the support member, wherein the fill material has a thixotropic index of from about four to about six.

21. The microelectronic substrate assembly of claim 20 wherein the at least one bond member includes a solder ball.

22. The microelectronic substrate assembly of claim 20 wherein the substrate surface is a first substrate surface and wherein the microelectronic substrate includes at least one second substrate surface extending away from the first substrate surface and a third substrate surface facing opposite the first substrate surface, and wherein the fill material engages a portion of the at least one second substrate surface extending from the first substrate surface to a point about 60% to about 70% of the distance from the first substrate surface to the third substrate surface.

23. A microelectronic substrate assembly for mounting to a support member, comprising:

a microelectronic substrate having a substrate surface and at least one bond member extending away from the substrate surface to define a fill region on the substrate surface, the bond member being configured to be bonded to the support member; and a volume of uncured fill material disposed in the fill region and having a first surface attached to at least the substrate surface, the fill material having a second surface exposed before attaching the microelectronic substrate to the support member, wherein the fill material has a thixotropic index of about five.

24. The microelectronic substrate assembly of claim 23 wherein the at least one bond member includes a solder ball.

25. The microelectronic substrate assembly of claim 23 wherein the substrate surface is a first substrate surface and wherein the microelectronic substrate includes at least one second substrate surface extending away from the first substrate surface and a third substrate surface facing opposite the first substrate surface, and wherein the fill material engages a portion of the at least one second substrate surface extending from the first substrate surface to a point about 60% to about 70% of the distance from the first substrate surface to the third substrate surface.

26. A microelectronic substrate assembly for mounting to a support member, comprising:

a microelectronic substrate having a substrate surface and at least one bond member extending away from the substrate surface to define a fill region on the substrate surface, the bond member being configured to be bonded to the support member; and a volume of uncured fill material disposed in the fill region and having a first surface attached to at least the substrate surface, the fill material having a second surface exposed before attaching the microelectronic substrate to the support member, wherein the fill material includes an uncured epoxy.

27. The microelectronic substrate assembly of claim 26 wherein the at least one bond member includes a solder ball.

28. A microelectronic device assembly, comprising:

a support member having a support member surface and a plurality of bond sites proximate to the support member surface;

a microelectronic substrate having a substrate surface and a plurality of bond members projecting away from the substrate surface and attached to the bond sites with the substrate surface facing toward the support member surface; and a fill material disposed between the support member surface and the substrate surface, the fill material having an uncured state thixotropic index of from about four to about six.

29. The assembly of claim 28 wherein the substrate surface is a first surface and the microelectronic substrate has a plurality of second surfaces extending away from the first surface and a third surface facing in a direction opposite the first surface, and wherein the fill material engages a portion of the second surfaces extending from the first surface to a point about 60% to about 70% of the distance from the first surface to the third surface of the microelectronic substrate.

30. The assembly of claim 28 wherein the fill material has a thixotropic index of about five.

31. The assembly of claim 28, further comprising an encapsulating material at least partially surrounding the microelectronic substrate and the fill material.

* * * * *